US006206066B1

United States Patent
Imanishi et al.

(10) Patent No.: US 6,206,066 B1
(45) Date of Patent: Mar. 27, 2001

(54) APPARATUS FOR MOUNTING AN ELECTRONIC COMPONENT

(75) Inventors: Makoto Imanishi, Neyagawa; Akira Kabeshita, Hirakata; Kohei Enchi, Osaka; Satoshi Shida, Katano, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/091,104

(22) PCT Filed: Dec. 12, 1996

(86) PCT No.: PCT/JP96/03625

§ 371 Date: Jun. 12, 1998

§ 102(e) Date: Jun. 12, 1998

(87) PCT Pub. No.: WO97/22994

PCT Pub. Date: Jun. 26, 1997

(30) Foreign Application Priority Data

Dec. 15, 1995 (JP) .................................................. 7-327538

(51) Int. Cl.$^7$ .............................. B32B 35/00; H01L 21/60
(52) U.S. Cl. ......................... 156/356; 156/538; 156/578; 29/739; 29/740
(58) Field of Search .................................. 156/291, 578, 156/538, 356; 29/832, 833, 834, 841, 854, 855, 739, 740, 743; 118/313, 315

(56) References Cited

U.S. PATENT DOCUMENTS

| 3,855,034 | * | 12/1974 | Miller ............................... 156/578 X |
| 3,933,187 | * | 1/1976 | Marlinski ......................... 156/578 X |
| 4,208,005 | * | 6/1980 | Nate et al. . | |
| 4,307,832 | * | 12/1981 | Taki et al. . | |
| 4,314,870 | * | 2/1982 | Ishida et al. ...................... 156/578 X |
| 4,656,048 | | 4/1987 | Kudoh et al. . | |
| 4,803,124 | * | 2/1989 | Kunz ................................ 156/278 X |
| 4,880,486 | * | 11/1989 | Maeda . | |
| 4,919,074 | * | 4/1990 | Kurihara et al. . | |
| 5,336,357 | * | 8/1994 | Layher et al. ................... 156/578 X |
| 5,875,545 | * | 3/1999 | DiStefano et al. ................. 29/841 X |

FOREIGN PATENT DOCUMENTS

| 0 321 238 | 6/1989 | (EP) . |
| 0 517 071 | 12/1992 | (EP) . |
| 0 582 375 | 2/1994 | (EP) . |
| 62-132331 | 6/1987 | (JP) . |
| 62-169433 | 7/1987 | (JP) . |
| 63-35616 | 2/1988 | (JP) . |
| 2-181494 | 7/1990 | (JP) . |
| 2-187095 | 7/1990 | (JP) . |
| 3-12938 | 1/1991 | (JP) . |
| 7-23422 | 3/1995 | (JP) . |
| 7-283246 | 10/1995 | (JP) . |

\* cited by examiner

*Primary Examiner*—Curtis Mayes
(74) *Attorney, Agent, or Firm*—Wenderoth, Lind & Ponack, L.L.P.

(57) ABSTRACT

A method of and apparatus for mounting an electronic component at a specified position of an object. The method includes applying a sealant in a first application process. The sealant is quickly, sufficiently and forcibly applied in the first application process simply by avoiding electrodes at the arrangement position, and tightly contacting the arranged electronic component and the object. Then the bonding of the electrodes is performed in the usual manner. A second application process is carried out by applying a sealant to the periphery of the electronic component in the same manner as in the convention method, which is sufficient to cause the sealant to flow to the sealant previously applied under the electronic component. The second application process can be accordingly conducted speedily and sufficiently. Air bubbles will not be trapped between the electronic component and the object, with the result that mounting failures due to breakage or corrosion of the electronic component can be reduced. Only a short period of time is required to apply the sealant even though it is applied twice, so that production time is shortened and production efficiency is improved.

18 Claims, 8 Drawing Sheets

APPARATUS FOR MOUNTING AN ELECTRONIC COMPONENT

TECHNICAL FIELD

The present invention relates to a method for mounting an electronic component by means of arranging and sealing of the electronic component on an object such as a circuit board to which the component is mounted and, an apparatus and a dispenser used in the method.

BACKGROUND ART

A technique called as COB (CHIP ON BOARD) has attracted attention in recent years, as a way of mounting electronic components on a circuit board, in which electronic components are mounted onto electrodes on a circuit board in a state of the electronic components faced downward. The COB technique will be described with reference to the drawings.

Figures 9, 10A, 10B, 10C:
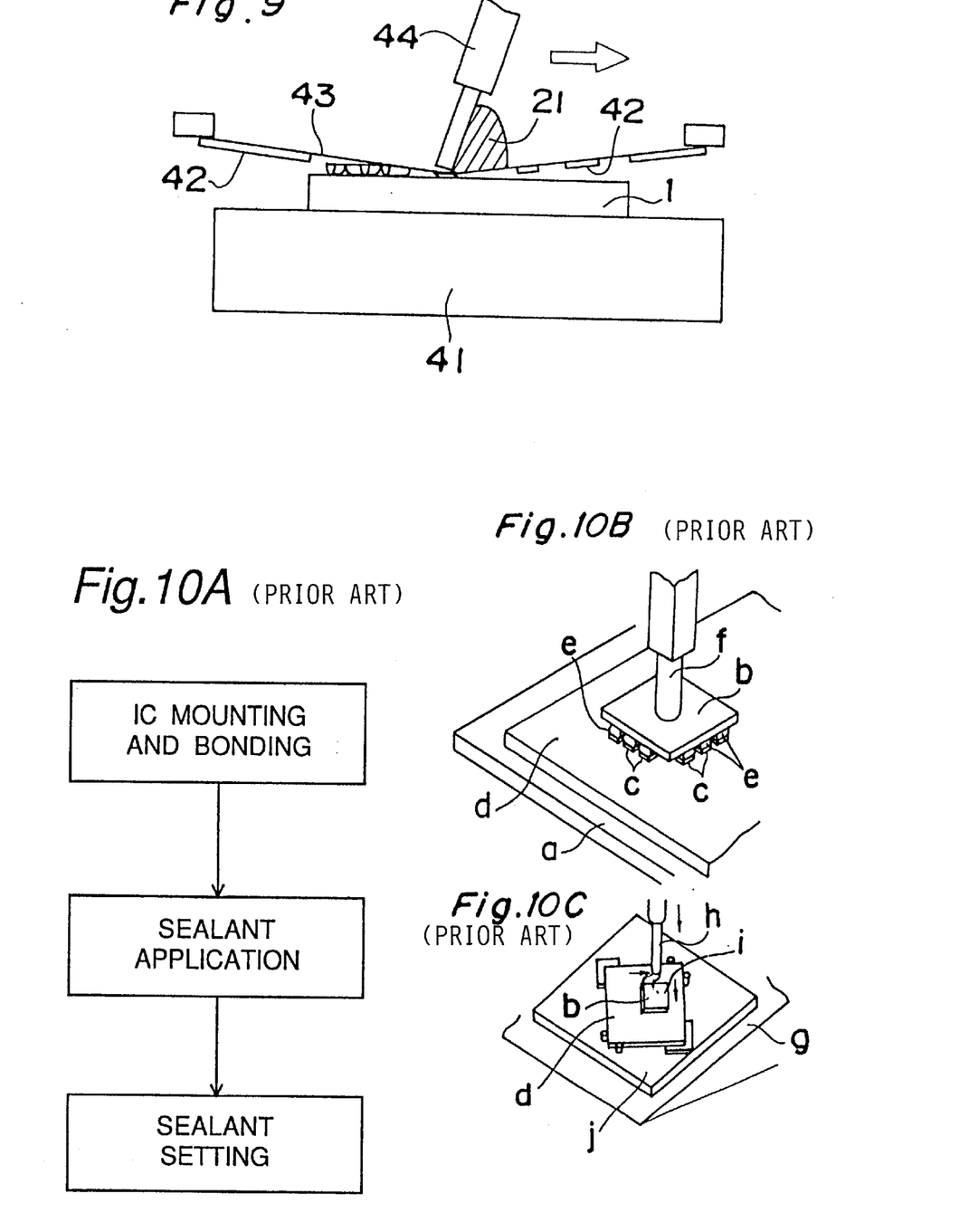
FIG. 9 is a sectional view of an application operation conducted by an applying device used in an applying process of a mounting method and a mounting apparatus utilizing a screen printing method according to a third embodiment of the present invention.
FIGS. 10A, 10B, 10C are a flow chart of a conventional mounting method of sealing an electronic component and perspective views of an apparatus used in two processes of the method.

FIG. 10A is a flow chart of the conventional COB method. Based on this figure, the description is made. Referring first to FIG. 10B, according to the conventional COB method, an electronic component b is first arranged and bonded to a circuit board d. Electrode parts c as shown in FIG. 10B are provided on the circuit board d for the electric connection to the electronic component b. The circuit board d is held at a stage a in FIG. 10B. Meanwhile, electrode parts of the electronic component b have bumps e to be bonded with the electrode parts c of the circuit board d. Each bump e is coated with a silver paste or the like for the bonding. The electronic component b is transferred while being sucked by a nozzle f, and positioned at an arrangement position on the board d. After the electronic component b is arranged on the board d, the silver paste is fused by heat thereby to bond the electronic component. Thereafter, a sealant is applied in the periphery of the electronic component b as indicated in FIG. 10C. The sealant i is applied by a dispenser h along a higher position side of the electronic component b after the circuit board d is held slantwise with the use of, for instance, an inclination stage g shown in FIG. 10C. In this manner, the applied sealant i is allowed to flow to a lower portion of the electronic component b along the inclination of the circuit board d. The sealant i is set with heat to complete the bonding. Reference symbol j in FIG. 10C indicates a positioning base for positioning the circuit board d.

The conventional method as above finds difficulty in flowing the sealant i to the lower portion of the electronic component b, because a gap between a lower face of the electronic component b and the circuit board d is as narrow as several tens $\mu$m, and moreover the sealant i is highly viscous. A feed time for the flow of sealant i is consequently apt to be lengthy, in other words, production time is lengthened thereby lowering production efficiency. Besides, the sealant i fed to the gap tends to be insufficient in feed amount, resulting in the formation of air bubbles which are to be enclosed. When the air bubbles are present between the component b and the circuit board d, and the periphery of the electronic component b is sealed to tightly close the gap between them, an expansion/shrinkage of the air in the bubbles will occur due to change of the surrounding temperature. A pressure increase or decrease due to the expansion/shrinkage of air bubbles sometimes invites breaks of the electronic component b or the humidity in the air bubbles causes corrosion of the electrode or the like, thus leading to mounting faults.

The present invention is devised to solve the aforementioned issues, and has for its object to provide a method for mounting an electronic component by applying a sealant beforehand at an arrangement position of the component on an object where the electronic component is to be mounted thereby to positively apply the sealant under the electronic component, so that the electronic component can be sealed quickly and sufficiently with the occurence of breaks, corrosion or the like mounting failures being reduced, thereby improving production efficiency, and an apparatus and a dispenser used in the method.

SUMMARY OF INVENTION

In order to accomplish the above-described objective, a method for mounting an electronic component according to a first aspect of the present invention comprises:

a first application process of applying a sealant to a position of an object to which an electronic component is to be mounted where the electronic component is to be arranged, in a manner to avoid an electrode part of the object;

a bond process of arranging and bonding the electronic component at the arrangement position; and a second application process of applying a sealant at least partly to periphery of the electronic component after bonded onto the object.

According to a second aspect of the present invention, in the first aspect, at least the first application process among the first and second application processes uses a writing method.

According to a third aspect of the present invention, in the first aspect, the first application process uses a screen print method.

According to a fourth aspect of the present invention, in any one of the first-third aspects, different sealants are used in the first and second application processes.

According to a fifth aspect of the present invention, in the fourth aspect, the sealant in the first application process has heat cycle function and moisture resistance and resists being mingled with air bubbles, while the sealant in the second application process smoothly fits to a bump of an electrode part of the electronic component, and has good fluidity and low surface tension.

According to a sixth aspect of the present invention, in any one of the first-fifth aspects, the sealant in the first application process is multifunctional epoxy, while the sealant in the second application process is one selected from silicone, flame retardant epoxy and acrylic resin.

According to a seventh aspect of the present invention, an apparatus for mounting an electronic component is provided, which comprises:

a holding device for holding an object to which the electronic component is to be mounted;

a first applying device for applying a sealant to an arrangement position of the object held by the holding device where the electronic component is to be arranged, in a manner to avoid an electrode part of the object;

a bonding device for arranging and bonding the electronic component at the arrangement position of the object; and a second applying device for applying a sealant at least partly to periphery of the electronic component after bonded on the object.

According to an eighth aspect of the present invention, in the seventh aspect, at least the first applying device among the first and second applying devices is a writing device.

According to a ninth aspect of the present invention, in the seventh aspect, the first applying device is a screen printing device.

According to a 10th aspect of the present invention, in any one of the seventh-ninth aspects, different sealants are used in the first and second applying devices.

According to an 11th aspect of the present invention, in the 10th aspect, the sealant used by the first applying device has heat cycle function and moisture resistance and resists being mingled with air bubbles, while the sealant used by the second applying device smoothly fits to a bump of an electrode part of the electronic component, and has good fluidity and low surface tension.

According to a 12th aspect of the present invention, in any one of the seventh-11th aspects, multifunctional epoxy is used as the sealant used by the first applying device, while one selected from silicone, flame retardant epoxy, and acrylic resin is used as the sealant used by the second applying device.

According to a 13th aspect of the present invention, in any one of the seventh-12th aspects, the first applying device has a dispenser equipped with a plurality of discharge openings for the sealant, and control devices for controlling discharge amounts of the sealant from the corresponding discharge openings individually.

A dispenser according to a 14th aspect of the present invention is used in the mounting apparatus in any one of the seventh-13th aspects, which has a plurality of discharge openings, wherein sealant feed paths are provided individually to the corresponding discharge openings.

According to a 15th aspect of the present invention, in any one of the first-sixth aspects, a thickness of the sealant applied in the first application process is not smaller than a height of the electrode of the electronic component and a height of the electrode of the object.

According to a 16th aspect of the present invention, in any one of the seventh-13th aspects, a thickness of the sealant applied by the first applying device is not smaller than a height of the electrode of the electronic component and a height of the electrode of the object.

In the first aspect of the present invention, the electronic component is arranged at the position of the object to which the electronic component is to be mounted and where the sealant is applied beforehand in the first application process. The sealant is quickly, sufficiently and forcibly applied in the first application process simply by avoiding the electrode at the arrangement position, to be in tight contact with the arranged electronic component and the object, and then, without causing any obstruction to a successive bonding of electrodes of the electronic component and the object, the bonding of the electrodes is performed usually. In the second application process, the sealant is applied to the periphery of the electronic component in the same manner as conventionally, which is enough to send a sealant to the sealant applied beforehand under the electronic component. The second application process is accordingly conducted speedily and sufficiently. Air bubbles are hard to mingle with the sealant between the electronic component and the object, whereby mounting failures due to breakage or corrosion of the electronic component because of the air bubbles can be reduced. The sealant is applied each time in a short time although applied twice, so that a production time is shortened and production efficiency is improved. The first application process serves to bond the electronic component arranged thereafter to the circuit board, and therefore the electronic component is prevented from being displaced after the arrangement. Moreover, the electronic component is bonded and sealed with improved performance, whereby a yield and product quality are enhanced.

In the second and eighth aspects of the present invention, an application locus and a movement speed in the writing method can be set freely, thereby to easily cope with any arrangement of electrodes on the object. Moreover, any required application density and application amount are satisfied with ease. Particularly, the writing method utilized in the first application is effective to reduce mounting failures furthermore. Since an application position of the sealant is correctly controlled, even the sealant of low viscosity does not flow to the electrodes and thus does not hinder the bonding of electrodes once a safe gap is properly secured to the electrodes. The low viscous sealant improves working efficiency further owing to its good fluidity.

In the third and ninth aspects of the present invention, any arrangement of electrodes on the object is coped with by the print pattern set beforehand to a screen, and a required application density is ensured, whereby mounting failures are decreased furthermore. The sealant can be applied instantaneously simply by opening/closing the screen and moving a squeegee to a plurality of electronic component arrangement positions at one time. Working efficiency is improved furthermore.

The fourth-sixth and 10th–12th aspects of the present invention can cope well with different application conditions such as different application methods, different instruments, etc. between the first and second application processes. Thus, each of the first and second applications can be performed well.

According to the seventh aspect, when the first applying device moves the dispenser, e.g., in three dimensions to the object held by the holding device, the sealant can be applied to the arrangement position except the electrode. Thereafter, the electronic component is arranged to the arrangement position by the bonding device. As a result, the bonding operation can be performed while the electrodes of the electronic component and the object confront each other without being disturbed by the sealant. Then, by the second applying device, the dispenser is moved and the sealant is applied to the periphery of the bonded electronic component, so that the sealing is completed. The mount method is hence carried out automatically.

According to the 13th aspect of the present invention, since the feed amounts of the sealant to the plurality of discharge openings are controlled individually, the application amount of the highly viscous sealant by the whole of the dispenser can be finely and correctly controlled to fit to a variety of application conditions in an optimum manner. If the discharge amount of the sealant from each discharge opening is controlled with a position of the discharge opening taken into consideration, the application amount can be effectively controlled, for instance, so that when the application locus is curved, the application amount is small at an inner side of a curved application locus and large at an outer side of the application locus, that is, to be uniform as a whole.

BRIEF DESCRIPTION OF DRAWINGS

These and other objects and features of the present invention will become clear from the following description taken in conjunction with the preferred embodiments thereof with reference to the accompanying Figures in which.

DETAILED DESCRIPTION OF THE INVENTION

Best Mode for Carrying Out the Invention

Before the description of the present invention proceeds, it is to be noted here that like parts are designated by like reference numerals throughout the accompanying figures.

Embodiments of the present invention will now be described with reference to FIGS. 1 through 9.

First Embodiment

Figure 1A:
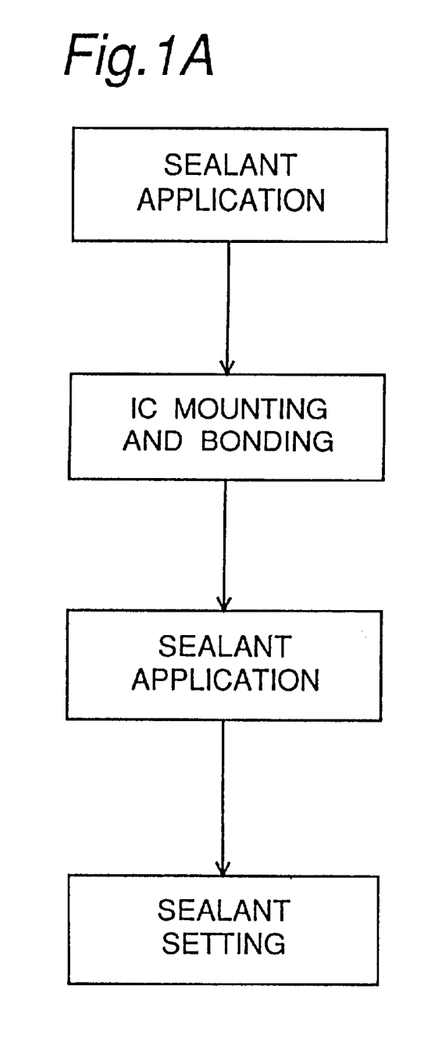
FIG. 1A is a flow chart of a method for mounting an electronic component according to a first embodiment of the present invention.
Figure 1B:
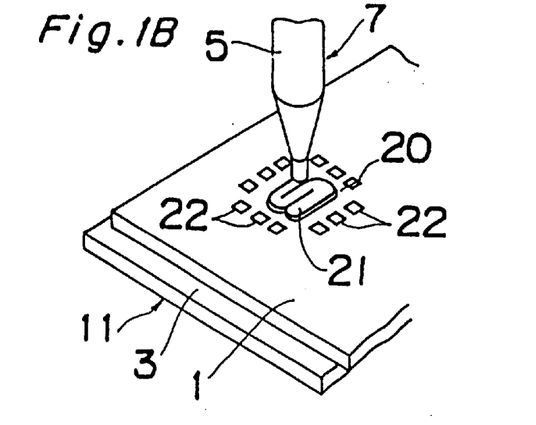
FIGS. 1B, 1C, 1D are perspective views showing a state when each process is executed with the use of an apparatus employed in the mounting method of the first embodiment.
Figure 1C:
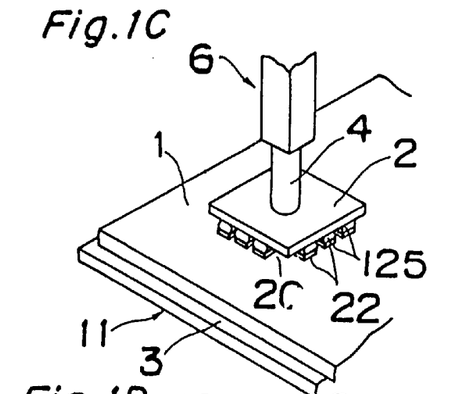
Figure 1D:
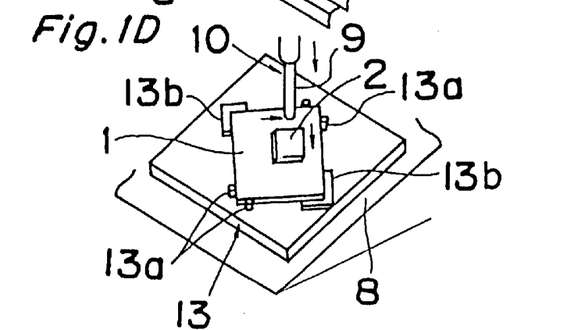
Figure 2:
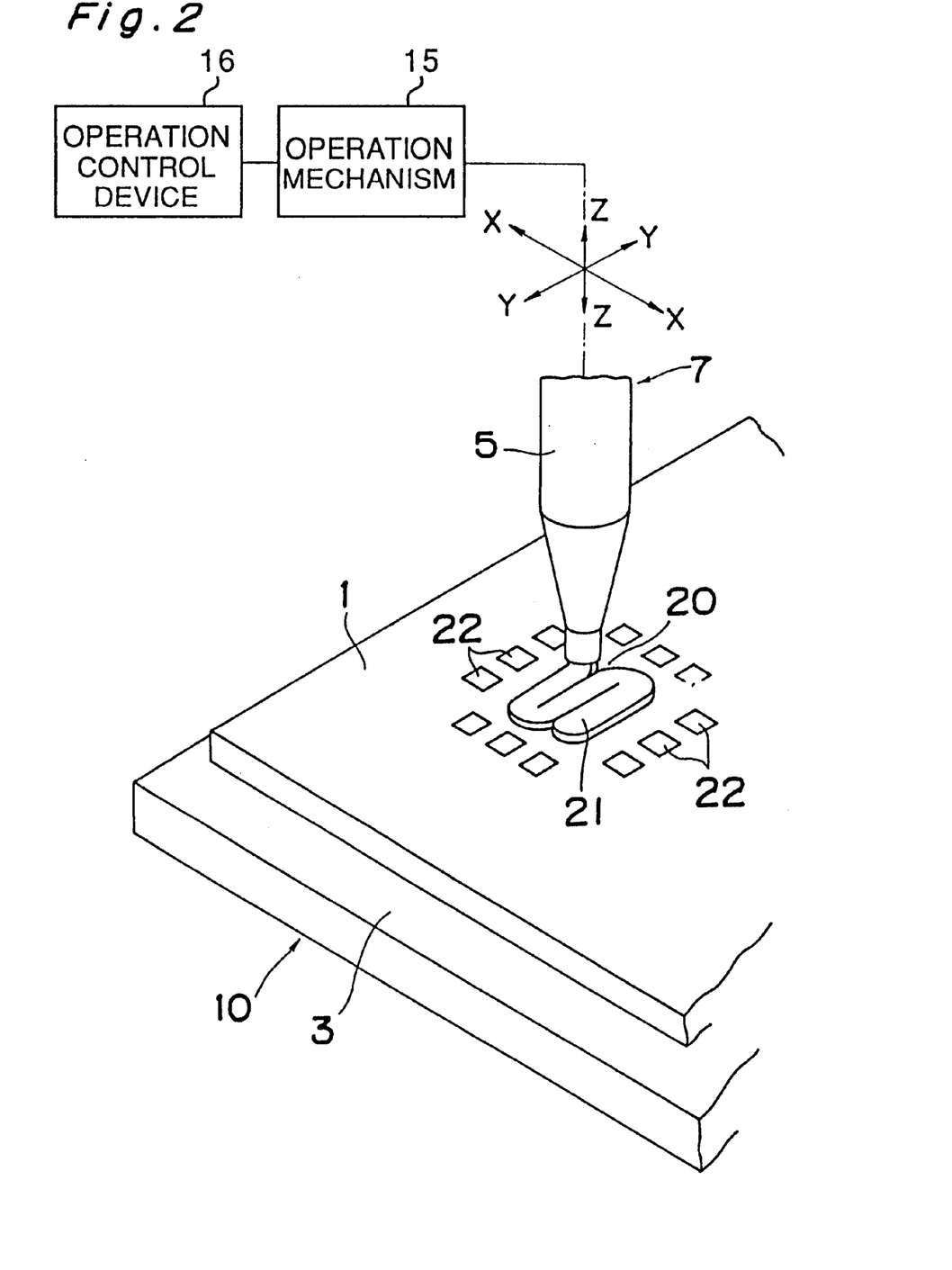
FIG. 2 is a perspective view of an applying device, employed in a first application process in the first embodiment, carrying out an application operation.
Figure 3:
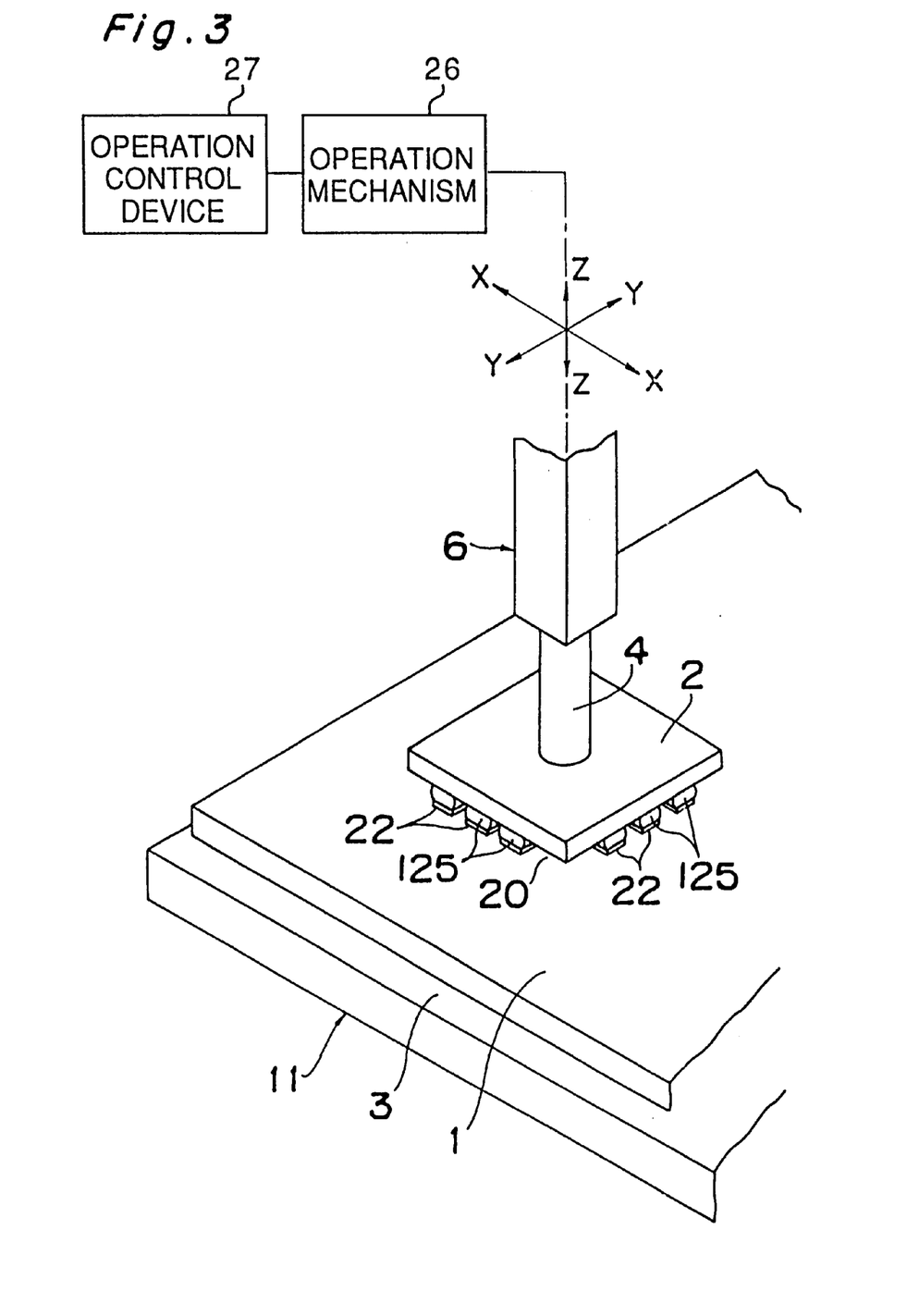
FIG. 3 is a perspective view of an arranging device, employed in an electronic component arrangement-bond processes in the first embodiment, arranging an electronic component.
Figure 4:
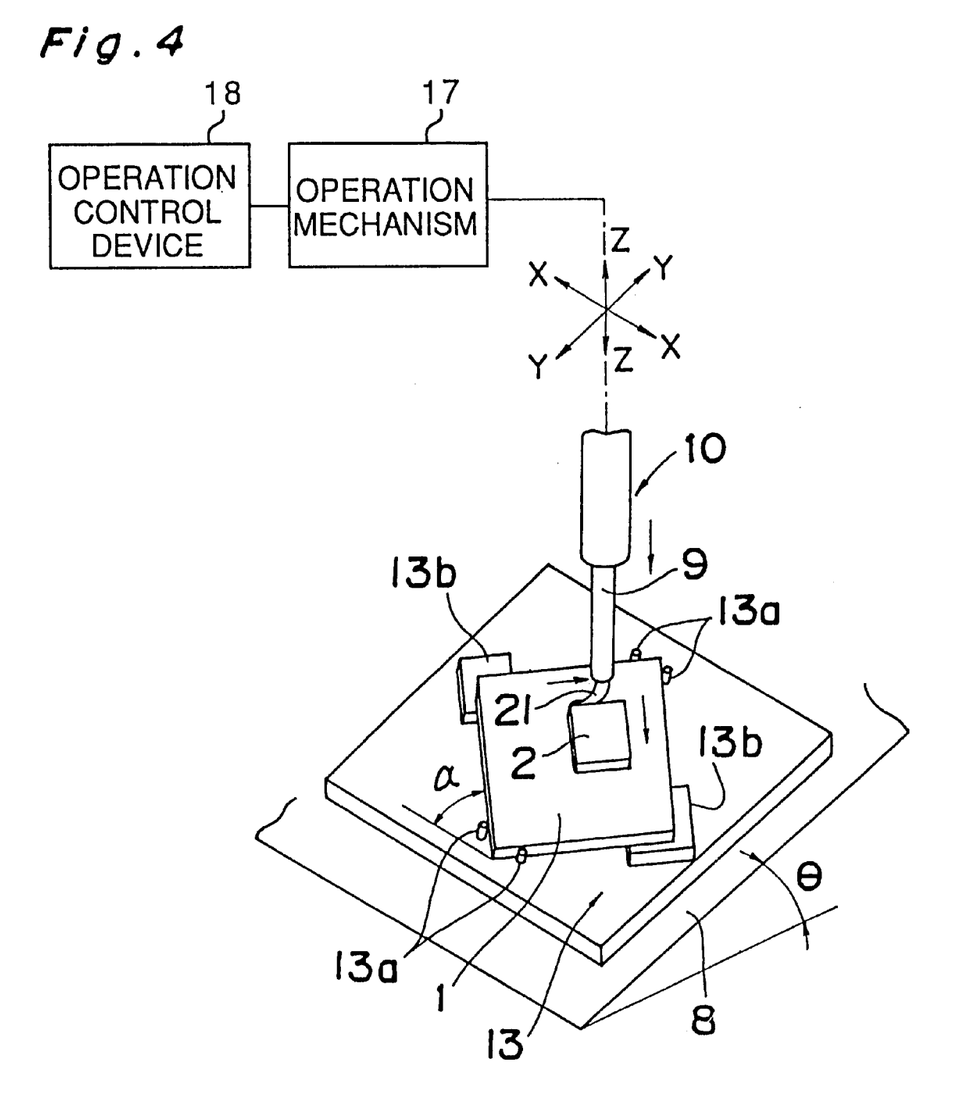
FIG. 4 is a perspective view of an applying device, employed in a second application process in the first embodiment, performing an application operation.

FIGS. 1 through 7 show a mounting method and a mounting apparatus according to a first embodiment of the present invention. As indicated in FIGS. 1B–1D, the first embodiment is related to mounting of an electronic component 2 to an object, e.g., a circuit board 1 on which the component is to be mounted. A mounting apparatus for the component 2 which comprises a positioning base 3 as a holding device 11 as shown in FIGS. 1B, 1C, 2, 3 for positioning and holding the circuit board 1, a bonding device using, for example, a suction nozzle 4 as shown in FIG. 1C as a bonding device 6 for arranging and bonding the electronic component 2 onto the circuit board 1, and a first sealant applying device 7 having a dispenser 5 arranged so as to be movable over the circuit board 1 in three dimensions as shown in FIGS. 1B, 2. Although it is satisfactory to position the bonding device 6 and the first applying device 7 at the same stage of the same machine, these devices may be positioned at different stages, or may be provided as individual mechanical devices to be used sequentially. According to the first embodiment, a second applying device 10 having an inclined stage 8 and a dispenser 9 as shown in FIGS. 1D and 4 is also used to conduct the same seal process as in the prior art to the periphery of the electronic component 2 after being bonded. The inclined stage 8 employs a positioning base 13 although the positioning base 13 may be different from the working stage used by the bonding device 6 and first applying device 7. The positioning base 13 is specifically provided to position the circuit board 1 in an inclined attitude without any shift or movement, and therefore the positioning base 13 has special positioning parts 13a, 13b. Each positioning part 13a is constructed of a pair of pins for positioning one corner part of the board 1, and each positioning part 13b is constituted of an L-shaped member to position one corner part of the board 1.

For example, the holding device 11 may be used for operations in the bonding device 6, first applying device 7 and second applying device 10. In that case, the holding device 11 holds the circuit board 1 in the inclined state each operation or inclines the circuit board only when the sealant is applied after the circuit board is bonded.

Figure 6:
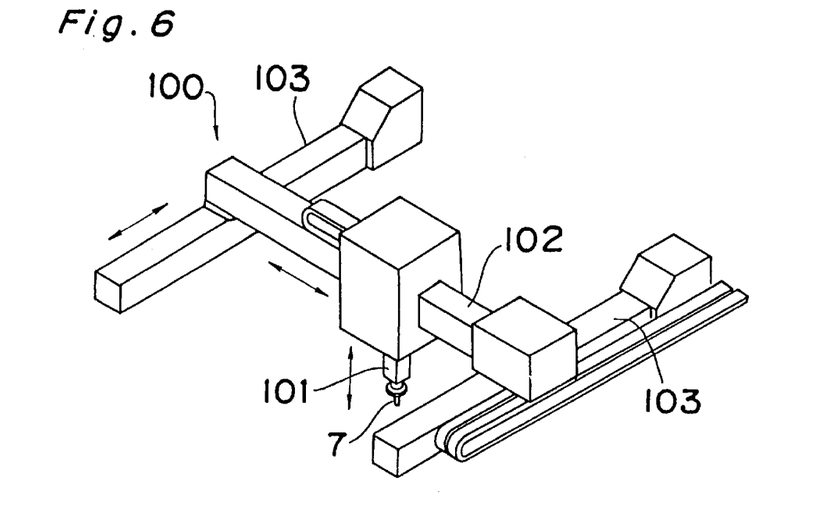
FIG. 6 is a perspective view of a moving mechanism for moving each of the two applying devices and the arranging device in the first embodiment.

The first and second applying devices 7, 10 are different devices in the first embodiment. In the event that the working stage is shared, preferably, a common device is used for the first and second applying devices. Also preferably, each of the dispensers 5, 9 of the first and second applying devices 7, 10 is moved back and forth and positionally controlled in X, Y directions that are orthogonal to each other on a horizontal plane and in a vertical Z direction that is orthogonal to the two directions for the application work, as shown in FIGS. 2, 3. A known XY robot as indicated in FIG. 6 is used therefor. FIG. 6 shows, as one example, an XY robot 100 for the first applying device 7. Reference numeral 101 denotes a Z-direction driving mechanism for moving the first applying device 7 up and down in the Z direction, 102 denotes an X-direction driving mechanism for moving back and forth in the X direction the first applying device 7 supported by the Z-direction driving mechanism 101, and 103 denotes a Y-direction driving mechanism for moving the X-direction driving mechanism 102 back and forth in the Y direction.

Naturally, the application of the sealant with the use of the applying device 7 is preferred to be performed by a writing device adapting a writing method in order to secure application accuracy. A highly accurate operating mechanism 15 and a highly accurate operation control device 16 are used. As a known example of the writing device, a writing device is disclosed in the published specification of Japanese Laid-Open Patent Publication No. 2-181494 which includes a cam mechanism rotated by a motor and having a dispenser (discharge nozzle) for discharging sealant from a discharge opening set in a movable fashion to be close to and away from a face to be written, and a moving device, equipped with a piezoelectric element, for moving the dispenser. Although the operation control device 16 may be a special controller, a microcomputer that can perform numerical control is convenient in terms of general and management of numerical values. In comparison with the writing method, the application by the applying device 10 is simple, therefore requiring an operating mechanism 17 and an operation control device 18 which are lower-grade than those set in the applying device 7. In other words, not so highly accurate, conventional ones are employed in the applying device 10.

Not only is an inclination angle (θ) of the inclined stage 8 changeable, but an angle (α) for holding the circuit board 1 can be changed. A most efficient application operation is provided through free setting of the angles θ and α. Specifically, θ is 15° and α is 45° when an epoxy phenol sealant of 150,000 cPs (at ordinary temperatures) is used.

Figure 7:
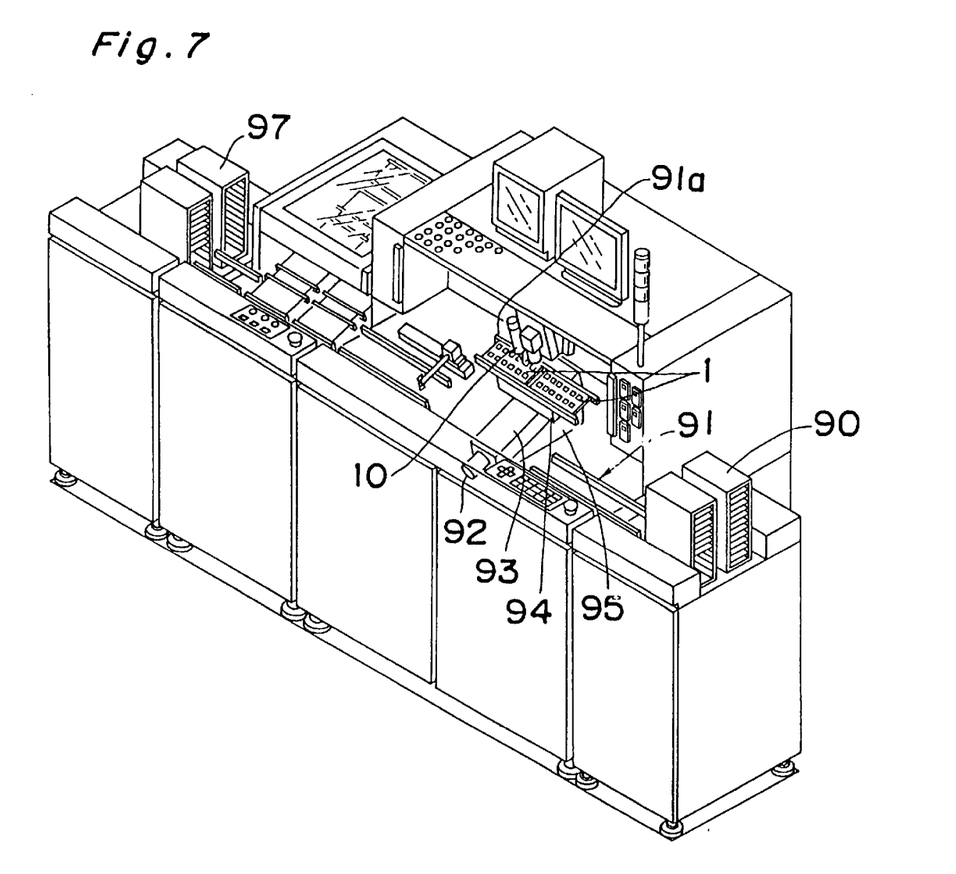
FIG. 7 is a perspective view of the whole of a mounting apparatus which is capable of carrying out the mounting method in the first embodiment.

The mounting apparatus according to the first embodiment is illustrated in FIG. 7 in which 90 is a storage area for the boards 1 before being mounted, 91 is a carrier device for carrying the boards 1 one by one from the storage area 90, 92 is a motor for moving a carrier part 91a to work positions for a first application process, an arrangement process, a second application process while the boards 1 are loaded on the carrier part 91a which is a part of the carrier device 91, 93 is a guide for guiding the movement of the carrier part 91a, 94 is a moving body supporting the carrier part 91a and being movable back and forth along the guide 93 by the motor 92, 95 is an inclining mechanism for inclining the whole of the moving body to a predetermined angle, and 97 is a storage area for storing mounted boards 1. By way of example, FIG. 7 shows a state in which the nozzle 4 of the bonding device 10 is set to the Z-direction driving mechanism 101 of the XY robot of FIG. 6. The inclining mechanism 95 includes the inclined stage and can incline the board 1 to the predetermined angle.

The electronic component 2 is mounted with the use of the above mounting apparatus, for example, by a method in accordance with a flow chart of FIG. 1A. The method will be described hereinbelow. As shown in FIGS. 1B and 2, a sealant 21 is applied to a position 20 of the circuit board 1 where the electronic component 2 is to be arranged, so as not to be applied to an electrode part 22 of the circuit board 1. This is a first application process and is carried out as widely and densely as possible in a predetermined thickness by the writing method referred to earlier, in the range where the sealant is not applied to the electrode part 22. The thickness of the sealant is not smaller than an interval defined between a bump and an electrode, so that it is preferable that a space is not present between a lower face of the electronic component 2 and a surface of the sealant 21 on a surface of the circuit board 1. More specifically, as an example, if the bump is 50 $\mu$m high and the electrode is 2 $\mu$m high, the sealant 21 is preferably at least 50 $\mu$m or higher which is the height of the bump because the electrode has the very small height of 2 $\mu$m, and more preferably, 52 $\mu$m or higher. An upper limit of the thickness of the sealant 21 is determined so that the sealant does not obstruct a connection between the electronic component 2 and confronting electrode of the circuit board 1 when the electronic component 2 is bonded to the circuit board 1. In the above example, the upper limit of the thickness of the sealant 21 is preferably approximately 55 $\mu$m. A writing locus and a locus density by the dispenser 5 are suitably set so as to control the thickness of the sealant 21 as above. The writing is performed in the first embodiment to linearly reciprocate the dispenser 5 continuously with a fine pitch as indicated in FIGS. 1B and 2. Needless to say, the present invention is not limited to this.

Figure 5:
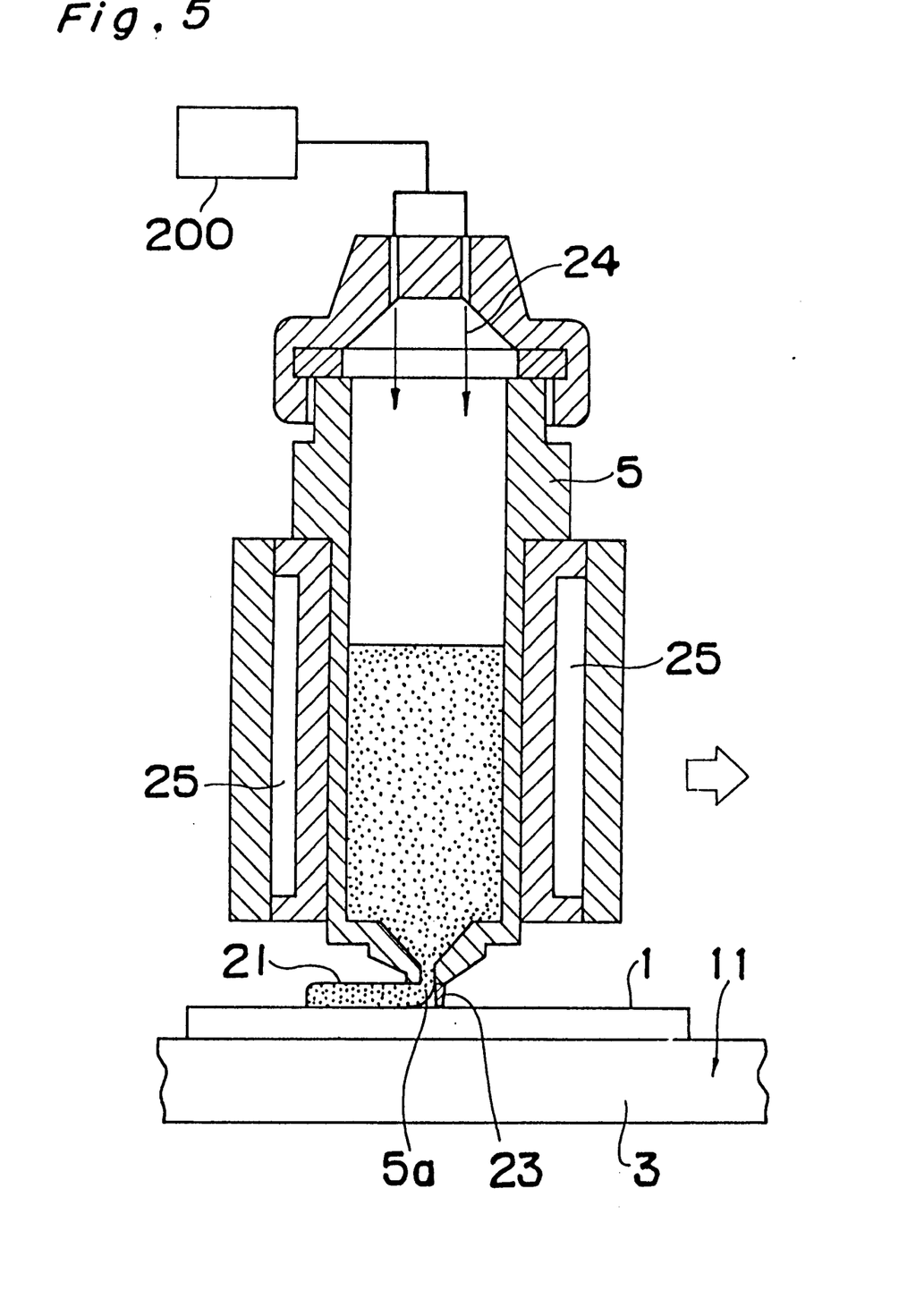
FIG. 5 is a sectional view of a dispenser employed, during a writing operation, in the applying device of FIG. 2 of the first embodiment.

In the first application process, a predetermined distance is secured between the circuit board 1 and a leading end of the dispenser 5 by a spacer 23 as shown in FIG. 5. The sealant 21 supplied to the dispenser 5 is discharged out through a discharge opening 5a by a pressure of compressed air 24 fed from a compressor 200. Simultaneously with the discharging, the dispenser 5 is driven to write in the above-described manner to the circuit board 1. At this time, a thermostatic water 25 is circulated in the periphery of the dispenser 5 to prevent a viscosity change of the sealant 21. Although the first embodiment uses the spacer 23, a distance-securing device such as the spacer 23 or the like can be eliminated in the event that the circuit board 1 and dispenser 5 are highly accurately held in a state parallel to each other, for instance, as disclosed in Japanese Laid-Open Patent Publication No. 2-187095, etc. and at the same time the sealant 21 is not required to be accurate with regard to the application amount. As a specified example, the distance is, e.g., 80–100 $\mu$m.

Then, as shown in FIGS. 1C and 3, the electronic component 2 is arranged so as to be bonded by the bonding device 6 at the arrangement position 20 of the circuit board 1 after the sealant is applied. As a result of the bonding, the electrodes 22 of the circuit board 1 and the electrodes of the electronic component 2 are connected with each other via bumps 125 of the electronic component 2. The bonding is executed in the same manner as in the prior art, and therefore the detailed description will be omitted here. For this arrangement-bond process, the nozzle 4 is controlled to move in X, Y directions that are orthogonal to each other on the horizontal plane and in a vertical Z direction by an operating mechanism 26 and an operation control device 27. Driving mechanisms for the control may be the same as employed in the applying device.

A second application process is performed by a second applying device 10 shown in FIGS. 1D and 4. Since the process is not different from the conventional one, the detailed description will be omitted. The sealant 21 is set by heat, and then the procedures are completed.

In the above-described manner, the electronic component 2 is mounted automatically by the mounting apparatus to the circuit board 1, including the seal process.

According to the above mounting method, the sealant is forcibly applied quickly and sufficiently in the first application process simply by avoiding the electrodes 22 that are present at the arrangement position 20 and, by becoming brought into tight contact with the electronic component 2 and circuit board 1. Therefore, the process does not hinder the subsequent bonding of electrodes of the electronic component 2 and the circuit board 1, and then the bonding is performed in the usual manner. When the sealant 21 is applied to the periphery of the electronic component 2 in the second application process similar to the prior art, it is enough to apply the sealant 21 to the sealant that are applied beforehand under the electronic component 2, and therefore the process can proceed speedily and sufficiently. Since it is difficult for air bubbles to enter the sealant 21 between the electronic component 2 and circuit board 1, mounting failures resulting from breaks or corrosion of the electronic component 2 because of the air bubbles can be lessened. Further, the sealant 21 can be applied in a short period of time although applied twice, thereby shortening the production time and improving production efficiency. The first application process effectively works and bonds the succeeding electronic component 2 arranged thereafter to the circuit board 1, so that the electronic component 2 is prevented from being displaced after the arrangement, and the fixing function of the bonded and sealed electronic component 2 can be improved. Accordingly, the yield and product quality are improved.

Since the application locus and movement speed can be set freely in the writing method, the method copes readily with any arrangement of the electrodes 22 on the circuit board 1, and thereby to easily meets any required application density and application amount. Particularly the writing method used in the first application process further lessens mounting failures. Since the application position of the sealant 21 can be controlled correctly, once the safety gap for the electrode 22 is set adequately, even the sealant having a low viscosity never flows to the electrodes and thus never obstructs the bonding, but enhances working efficiency more because of the low viscosity and good fluidity. Specifically, for example, while the prior art needs a sealant of approximately 150,000 cPs viscosity, one example of the first embodiment can use a sealant of 5000 cPs viscosity in the first application process and 5000 cPs viscosity in the second application process.

In other words, different sealants can be used in the first and second application processes, so that the sealants can be employed with different application conditions such as different methods or different instruments, in the first and second application processes, resulting in improved performance of the first and second applications. Specifically, for example, one that is superior in heat cycle function and moisture resistance and can eliminate air bubbles is selectable as the sealant in the first application process, while one that smoothly fits to the bumps, has good fluidity, low surface tension and high reliability can be selected as the sealant in the second application process. More specifically, multifunctional epoxy can be used as the sealant for the first application, and silicone, flame retardant epoxy or acrylic resin etc. can be used as the sealant for the second application.

The second applying device 10 is illustrated in an inclined state relative to the board 1 in FIG. 4. However, the device 10 is not limited to this position, and may be disposed so as to be orthogonal to the surface of the board 1.

Second Embodiment

Figure 8:
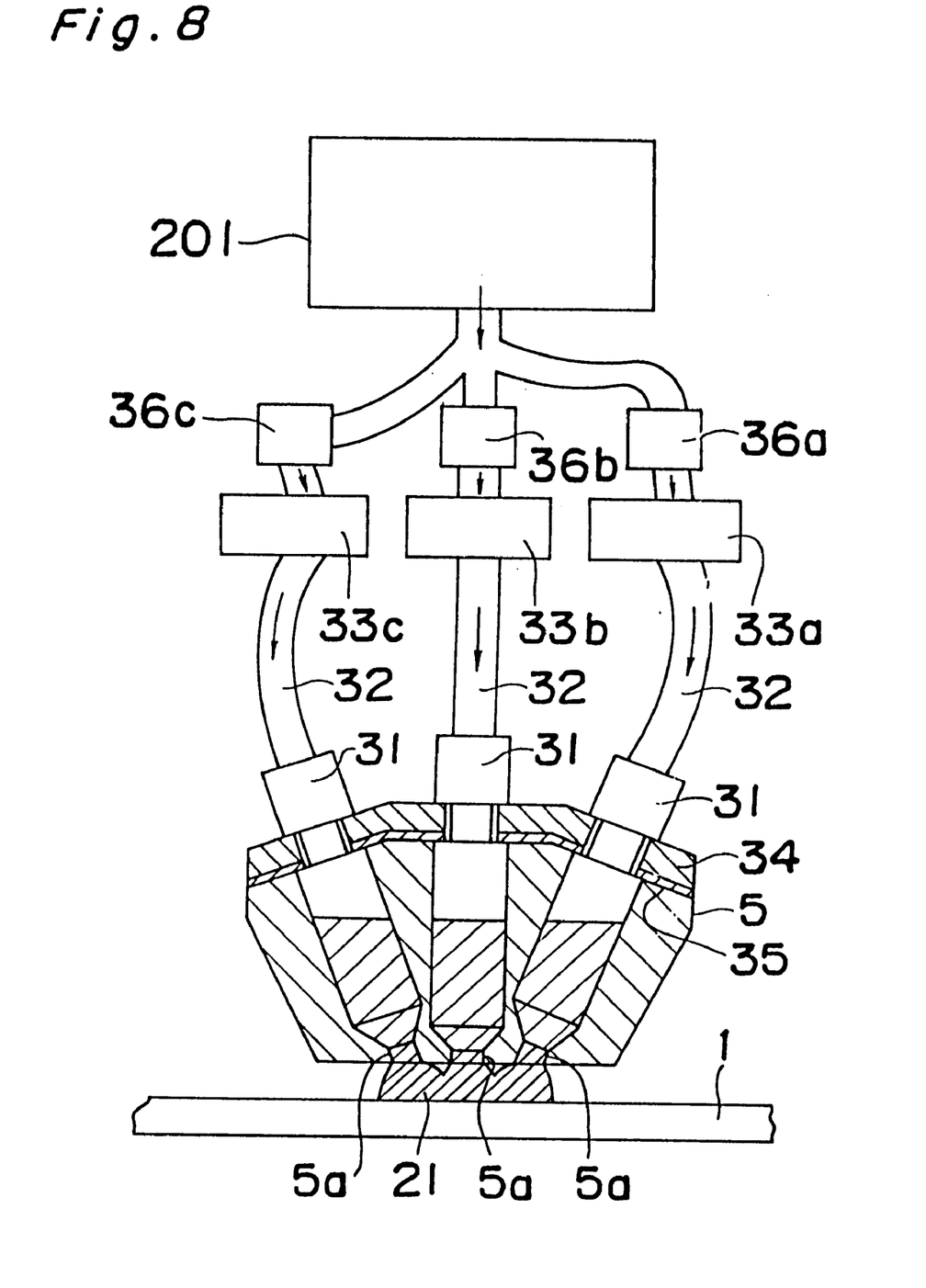
FIG. 8 is a sectional view of a dispenser used in a mounting method and a mounting apparatus according to a second embodiment of the present invention.

FIG. 8 shows a dispenser 5 which is particularly suitable for a first application process in a mounting method and a mounting apparatus according to a second embodiment of the present invention. The dispenser 5 has a plurality of discharge openings 5a for the sealant 21. In the second embodiment, three discharge openings 5 are provided and arranged in one row. However, the present invention is not restricted to this arrangement and a proper number of the discharge openings may be arranged in any manner.

The discharge openings 5a are connected to solenoid valves 33a, 33b, 33c by joints 31 and air tubes 32 respectively. Reference numerals 34, 35 in FIG. 8 indicate a cap of the dispenser 5 and an air leak prevention seal, respectively. The solenoid valves 33a, 33b, 33c are connected to regulators 36a, 36b, 36c, respectively. Each of the regulators 36a, 36b, 36c can regulate the pressure of air supplied from a compressor 201. Therefore, the discharge amount of the sealant 21 from each discharge opening 5a can be adjusted individually by adjusting the regulators 36a, 36b, 36c and adjusting opening/closing of the solenoid valves 33a, 33b, 33c. Thus, the regulators 36a–36b, solenoid valves 33a–33c function as a discharge amount control device.

In the above construction, since the sealant 21 can be discharged from three discharge openings 5a to a central part and both side parts thereof, the discharged sealant 21 assumes a rectangular section, thereby eliminating a minute step of the thickness in a breadthwise direction of the sealant 21 which is peculiar to the writing method. The sealant can be applied flat in the breadthwise direction into a truly rectangular cross section. By applying this construction in to the first applying device 7 of the first embodiment, the first application process can be achieved, and by apply the same construction to the second applying device 10 of the first embodiment, the second application process can be accomplished. The construction is thus efficient when one dispenser is shared for the first and second application processes. The dispenser 5 of the second embodiment can also be adapted to other general applications.

When the feed amount of the sealant 21 to the plurality of discharge openings 5a is controlled individually as above, the discharge amount of the whole dispenser 5, that is, the application amount by the whole dispenser 5 can be minutely and correctly controlled even if the sealant 21 has a high viscosity, e.g. nearly 150,000 cPs, which hence enables various application conditions in an optimum state. By controlling of the discharge amount of the sealant 21 from each discharge opening 5a and taking into consideration the position of the discharge opening, the application amount can be controlled so as to be small at an inner side of a curved application locus and large at an outer side of the application locus, and thus the sealant can be applied uniformly as a whole.

Third Embodiment

FIG. 9 indicates a screen printing device for carrying out a first application process in a mounting method and a mounting apparatus according to a third embodiment of the present invention.

This operation will be described. The circuit board 1 is held on a stage 41 serving as the holding device. A screen 43 patterned by an emulsion 42 is positioned so as to agree with a wiring pattern of the board 1. The sealant 21 is placed on the screen 43. The sealant 21 is applied on the circuit board 1 by moving a squeegee 44 held in pressed contact with the screen 43. The above is the same as a general method of screen printing. Nearly the same operation and effect as achieved in the first embodiment are realized in the first application process.

In comparison with the writing method whereby the sealant 21 is applied flat in the breadthwise direction, an edge of the pattern of the emulsion 42 formed on the screen 43 is sharpened and is easily separated from the screen. The third embodiment can achieve approximately the same effect although it is inferior to the writing method.

The method of the third embodiment can meet any arrangement of the electrodes on the circuit board 1 by the print pattern set beforehand on the screen 43 by the emulsion 42 and moreover, a required application density is fulfilled. Accordingly, defective mounting can be further reduced. Besides, the sealant 21 can be applied instantaneous simply by opening/closing the screen 43 and moving the squeegee 44, and applied at one time to arrangement positions of a plurality of electronic components 2, thereby improving production efficiency further.

As is made clear from the foregoing description of the present invention, the sealant is applied at the mounting position of the electronic component before the electronic component is positioned thereon. Therefore, mounting failures such as breaks, corrosion or the like caused by application faults of the sealant, e.g., enclosure of air bubbles, etc. can be reduced, and production time can be improved.

Although the present invention has been fully described in connection with the preferred embodiments thereof with reference to the accompanying figures, it is to be noted that various changes and modifications will be apparent to those skilled in the art. Such changes and modifications are to be understood as included within the scope of the present invention as defined by the appended claims unless they depart therefrom.

What is claimed is:

1. An apparatus for mounting an electronic component, said apparatus comprising:
   a holding device for holding an object on which the electronic component is to be mounted;
   a first applying device, for applying a sealant to an arrangement position of the object being held by the holding device, the arrangement position being a position on the object where the electronic component is to be arranged, wherein the sealant has a heat cycle function and moisture resistance and resists being mingled with air bubbles;

a bonding device for arranging and bonding the electronic component at the arrangement position of the object; and a second applying device for applying a sealant to at least a portion of the periphery of the electronic component after being bonded on the object, wherein the sealant smoothly fits to a bump of an electrode part of the electronic component, and the sealant has good fluidity and low surface tension, wherein different sealants are used in said first and second applying devices, and wherein said first applying device includes a dispenser having a plurality of sealant discharge openings, and a plurality of control devices for individually controlling discharge amounts from the discharge openings, respectively.

2. An apparatus for mounting an electronic component, said apparatus comprising:

a holding device for holding an object on which the electronic component is to be mounted;

a first applying device, for applying a sealant to an arrangement position of the object being held by the holding device, the arrangement position being a position on the object where the electronic component is to be arranged, wherein the sealant has a heat cycle function and moisture resistance and resists being mingled with air bubbles;

a bonding device for arranging and bonding the electronic component at the arrangement position of the object; and a second applying device for applying a sealant to at least a portion of the periphery of the electronic component after being bonded on the object, wherein the sealant smoothly fits to a bump of an electrode part of the electronic component, and the sealant has good fluidity and low surface tension, wherein different sealants are used in said first and second applying devices, and wherein said first applying device comprises a plurality of sealant paths terminating in a plurality of discharge openings, respectively.

3. An apparatus for mounting an electronic component, said apparatus comprising:

a holding device for holding an object on which the electronic component is to be mounted;

a first applying device, for applying a sealant to an arrangement position of the object being held by the holding device the arrangement position being a position on the object where the electronic component is to be arranged, wherein the sealant has a heat cycle function and moisture resistance and resists being mingled with air bubbles, a bonding device for arranging and bonding the electronic component at the arrangement position of the object; and a second applying device for applying a sealant to at least a portion of the periphery of the electronic component after being bonded on the object, wherein the sealant smoothly fits to a bump of an electrode part of the electronic component, and the sealant has good fluidity and low surface tension, wherein multifunctional epoxy is used as the sealant in said first applying device, and one selected from silicone, flame retardant epoxy, and acrylic resin is used as the sealant in said second applying device, wherein said first applying device includes a dispenser having a plurality of sealant discharge openings, and a plurality of control devices for individually controlling discharge amounts from the discharge openings, respectively.

4. An apparatus for mounting an electronic component, said apparatus comprising:

a holding device for holding an object on which the electronic component is to be mounted;

a first applying device, for applying sealant to an arrangement position of the object being held by the holding device, the arrangement position being a position on the object where the electronic component is to be arranged, wherein the sealant has a heat cycle function and moisture resistance and resists being mingled with air bubbles;

a bonding device for arranging and bonding the electronic component at the arrangement position of the object; and a second applying device for applying a sealant to at least a portion of the periphery of the electronic component after being bonded on the object, wherein the sealant smoothly fits to a bump of an electrode part of the electronic component, and the sealant has good fluidity and low surface tension, wherein said first applying device includes a dispenser having a plurality of sealant discharge openings, and a plurality of control devices for individually controlling discharge amounts from the discharge openings, respectively.

5. An apparatus as claimed in claim 4, wherein each of said control devices comprises:

a regulator for regulating air pressure; and a solenoid valve communicating with said regulator and said respective discharge opening.

6. An apparatus as claimed in claim 4, wherein said first applying device comprises a plurality of sealant paths terminating in a plurality of discharge openings, respectively.

7. An apparatus as claimed in claim 4, wherein said first sealing device is adapted to apply the sealant in a thickness that is not smaller than a combined height of the electrode of the electronic component and the electrode of the object.

8. An apparatus for mounting an electronic component, said apparatus comprising:

a holding device for holding an object on which the electronic component is to be mounted;

A first applying device, for applying a sealant to an arrangement position of the object being held by the holding device, the arrangement position being a position on the object where the electronic component is to be arranged, wherein the sealant has a heat cycle function and moisture resistance and resists being mingled with air bubbles;

a bonding device for arranging and bonding the electronic component at the arrangement position of the object; and a second applying device for applying a sealant to at least a portion of the periphery of the electronic component after being bonded on the object, wherein the sealant smoothly fits to a bump of an electronic part of the electronic component, and the sealant has good fluidity and low surface tension, wherein said first applying device comprises a plurality of sealant paths terminating in a plurality of discharge openings, respectively.

9. An apparatus for mounting an electronic component, said apparatus comprising:
- a holding device for holding an object to which the electronic component is to be mounted;
- a first sealant applying device including a dispenser having a plurality of discharge openings and a plurality of control devices for individually controlling discharge amounts of sealant from the discharge openings, wherein said first applying device is adapted to apply the sealant to an arrangement position on the object where the electronic component is to be arranged while avoiding an electrode part of the object;
- a bonding device for arranging and bonding the electronic component at the arrangement position of the object; and
- a second applying device for applying a sealant to at least a portion of a periphery of the electronic component after being bonded onto the object.

10. An apparatus as claimed in claim 9, wherein said second applying device is a writing device.

11. An apparatus as claimed in claim 10, wherein the sealants, used in said first and second applying devices, are different types of sealants.

12. An apparatus as claimed in claim 11, wherein the sealant used in the first applying device has heat cycle function and moisture resistance and resists being mingled with air bubbles, and the sealant used in said second applying device smoothly fits to a bump of an electrode part of the electronic component and has good fluidity and low surface tension.

13. An apparatus for mounting an electronic component as claimed in claim 10, wherein the sealant used in the first applying device is a multifunctional epoxy, and the sealant used in the second applying device is one selected from silicone, flame retardant epoxy, and acrylic resin.

14. An apparatus as claimed in claim 9, wherein the sealants, used in said first and second applying devices, are different types of sealants.

15. An apparatus as claimed in claim 14, wherein the sealant used in the first applying device has heat cycle function and moisture resistance and resists being mingled with air bubbles, and the sealant used in said second applying device smoothly fits to a bump of an electrode part of the electronic component and has good fluidity and low surface tension.

16. An apparatus for mounting an electronic component as claimed in claim 14, wherein the sealant used in the first applying device is a multifunctional epoxy, and the sealant used in the second applying device is one selected from silicone, flame retardant epoxy, and acrylic resin.

17. An apparatus for mounting an electronic component as claimed in claim 9, wherein the sealant used in the first applying device is a multifunctional epoxy, and the sealant used in the second applying device is one selected from silicone, flame retardant epoxy, and acrylic resin.

18. An apparatus for mounting an electronic component as claimed in claim 9, wherein said bonding device includes a suction nozzle.

* * * * *